US010634568B2

(12) United States Patent
Rey

(10) Patent No.: US 10,634,568 B2
(45) Date of Patent: Apr. 28, 2020

(54) METHOD FOR MANUFACTURING A TORQUE SENSOR COMPRISING A STEP OF ENCAPSULATING THE ELECTRONIC CIRCUIT OF THE SENSOR

(71) Applicant: JTEKT EUROPE, Irigny (FR)

(72) Inventor: Laurent Rey, Villeurbanne (FR)

(73) Assignee: JTEKT EUROPE, Irigny (FR)

( * ) Notice: Subject to any disclaimer, the term of this patent is extended or adjusted under 35 U.S.C. 154(b) by 39 days.

(21) Appl. No.: 16/077,430

(22) PCT Filed: Jan. 25, 2017

(86) PCT No.: PCT/FR2017/050169
§ 371 (c)(1),
(2) Date: Aug. 10, 2018

(87) PCT Pub. No.: WO2017/137678
PCT Pub. Date: Aug. 17, 2017

(65) Prior Publication Data
US 2019/0064016 A1 Feb. 28, 2019

(30) Foreign Application Priority Data
Feb. 10, 2016 (FR) ...................... 16 51061

(51) Int. Cl.
*G01L 3/00* (2006.01)
*G01L 3/10* (2006.01)
(Continued)

(52) U.S. Cl.
CPC ................ *G01L 3/104* (2013.01); *B62D 6/10* (2013.01); *B62D 15/0215* (2013.01); *G01L 5/221* (2013.01); *G01R 33/07* (2013.01)

(58) Field of Classification Search
CPC ........... G01L 3/104; G01L 5/221; B62D 6/10; B62D 15/0215; G01R 33/07
(Continued)

(56) References Cited

U.S. PATENT DOCUMENTS 9,689,762 B2 * 6/2017 Takahashi ................ B62D 6/10
2003/0154800 A1 * 8/2003 Laidlaw .................... B62D 6/10
73/781
(Continued)

FOREIGN PATENT DOCUMENTS

EP 1 816 457 A2 8/2007
JP 2009-092463 A 4/2009

OTHER PUBLICATIONS

Apr. 10, 2017 International Search Report issued in International Patent Application No. PCT/FR2017/050169.

*Primary Examiner* — Max H Noori
(74) *Attorney, Agent, or Firm* — Oliff PLC

(57) ABSTRACT

A method for manufacturing a torque sensor includes: placing a first slip ring and a second slip ring inside a sensor case, the slip rings being distant from each other and each carrying respectively a first measuring terminal and a second measuring terminal which delimit an air gap therebetween; producing a sensor beam and a sensor beam subassembly, the sensor beam subassembly comprising a Hall effect cell configured to be placed in the air gap and measure the magnetic flux therein, and an electrical connection interface; and introducing the sensor beam into an access orifice which passes through a wall of the sensor case to open on the air gap, so as to place the Hall effect cell in the air gap, then fastening the sensor beam on the sensor case.

11 Claims, 4 Drawing Sheets

(51) Int. Cl.
*B62D 6/10* (2006.01)
*G01L 5/22* (2006.01)
*B62D 15/02* (2006.01)
*G01R 33/07* (2006.01)

(58) Field of Classification Search
USPC .................................................. 73/862.325
See application file for complete search history.

(56) References Cited

U.S. PATENT DOCUMENTS

| | | | |
|---|---|---|---|
| 2003/0167857 A1 | 9/2003 | Sugimura et al. | |
| 2007/0180905 A1* | 8/2007 | Kaoku | G01L 3/104 73/331 |
| 2012/0285266 A1* | 11/2012 | Takahashi | B62D 6/10 73/862.331 |
| 2014/0007701 A1* | 1/2014 | Maehara | G01L 3/104 73/862.325 |
| 2015/0316062 A1* | 11/2015 | Rosinski | H02K 29/08 417/423.3 |
| 2016/0153850 A1* | 6/2016 | Takahashi | G01R 33/07 73/862.325 |

* cited by examiner

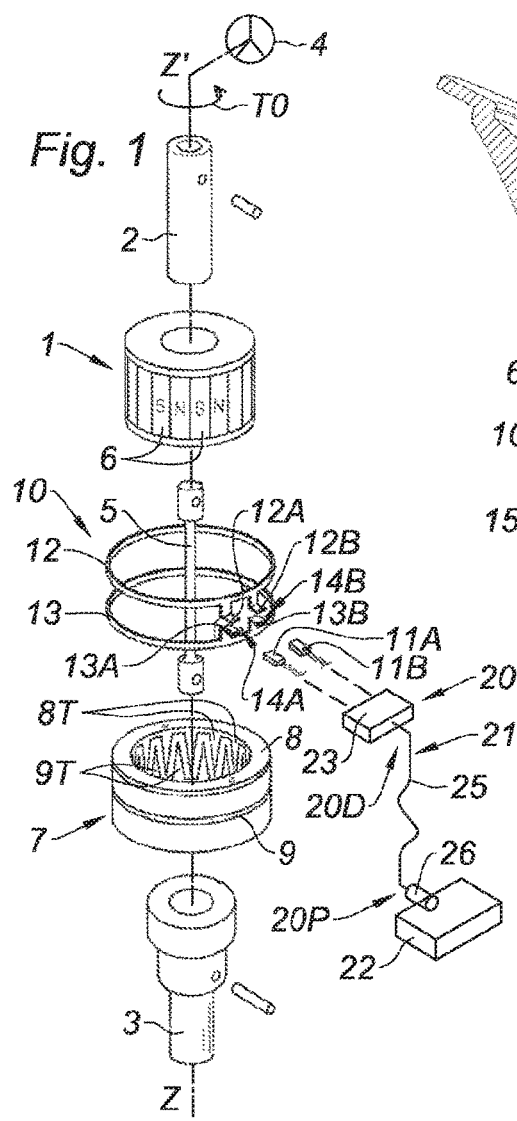
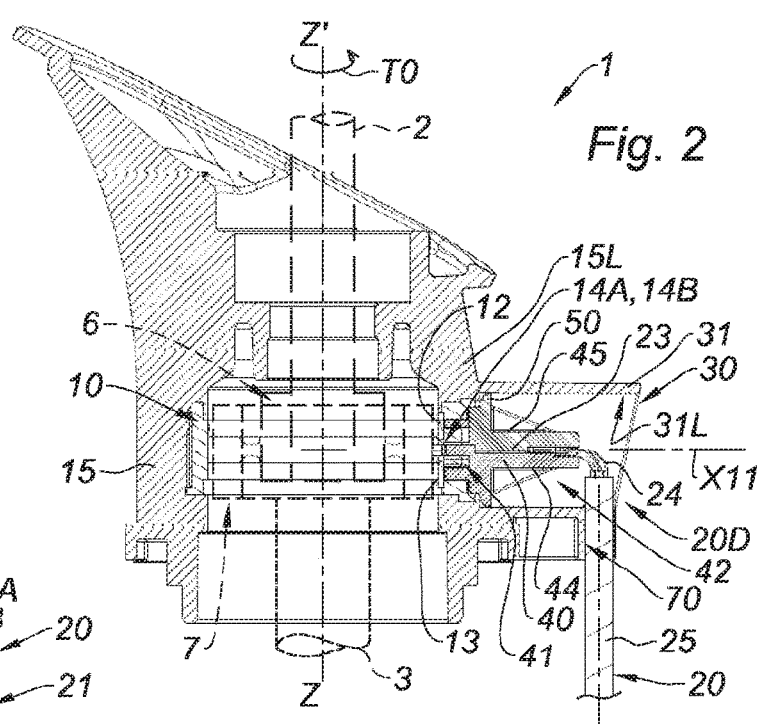
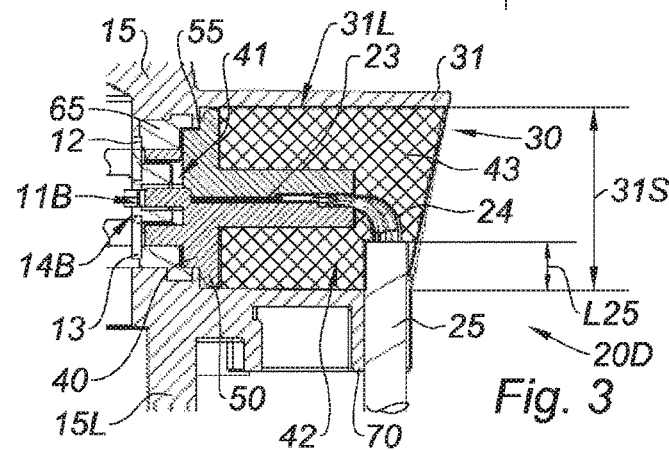
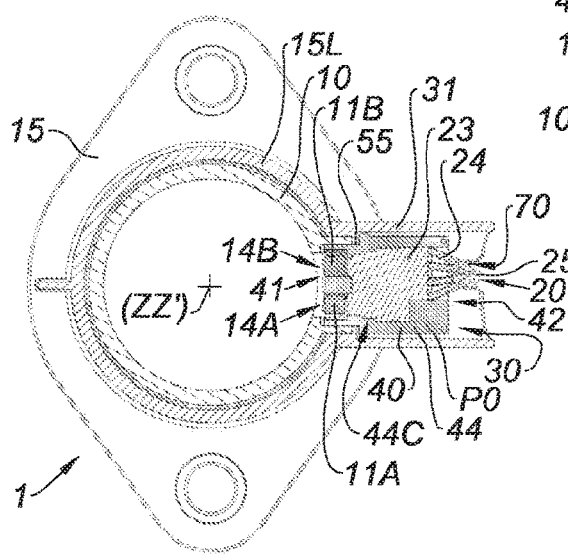
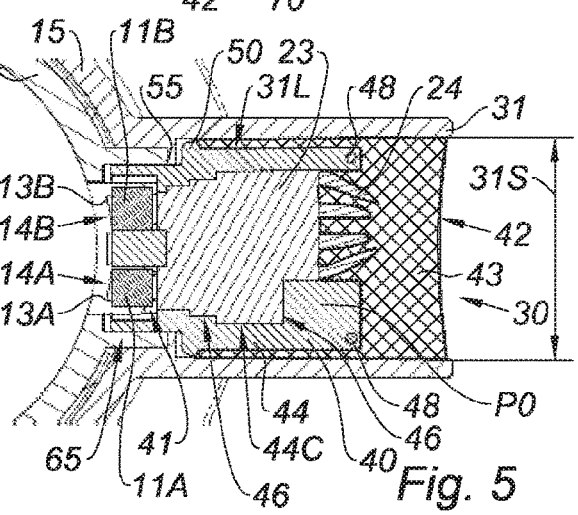
Fig. 1
Fig. 2
Fig. 3
Fig. 4
Fig. 5

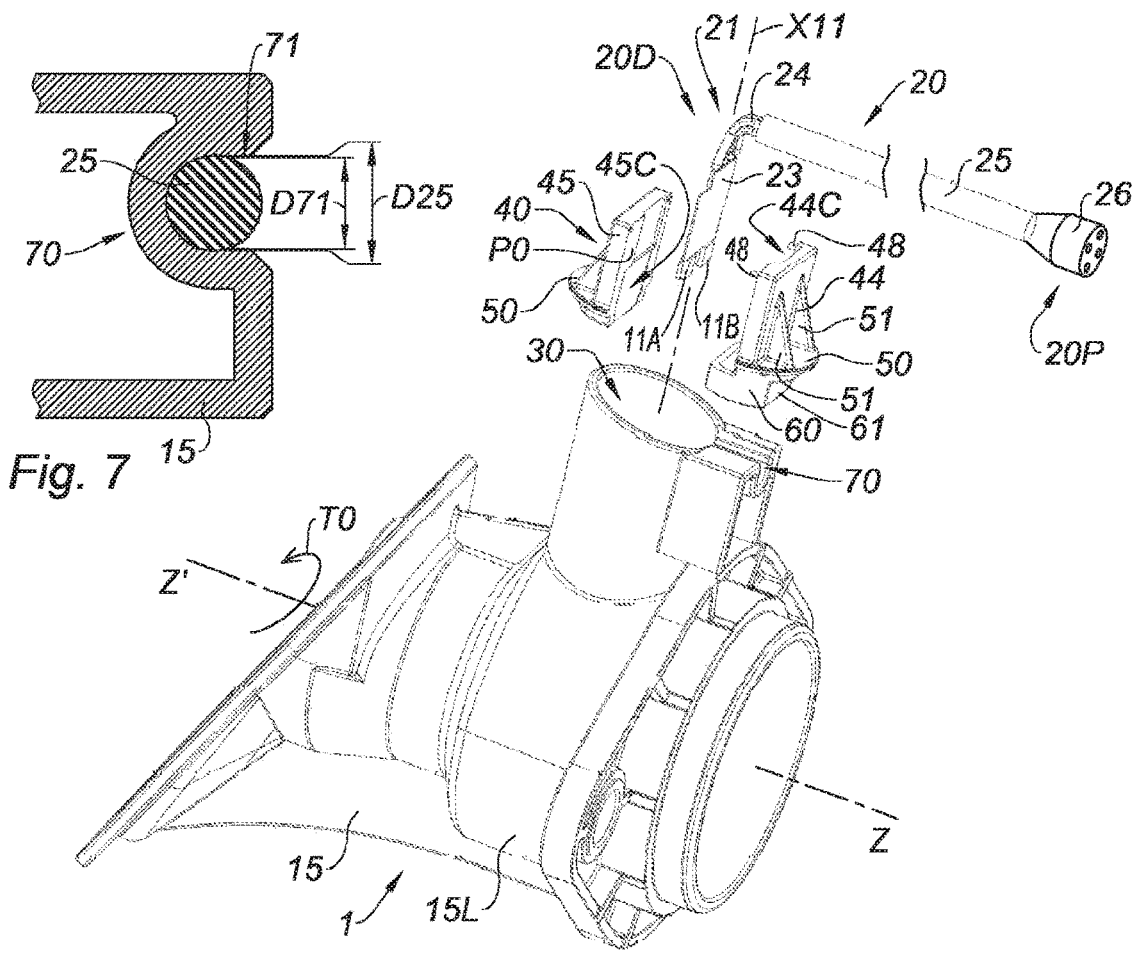
Fig. 7
Fig. 6
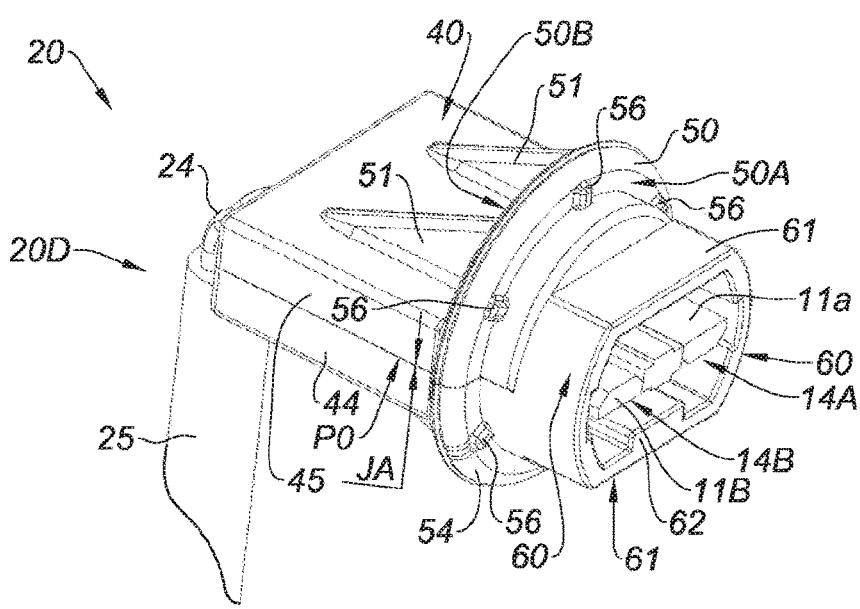
Fig. 8

METHOD FOR MANUFACTURING A TORQUE SENSOR COMPRISING A STEP OF ENCAPSULATING THE ELECTRONIC CIRCUIT OF THE SENSOR

The present invention concerns the manufacture of torque sensors.

The invention concerns more particularly the manufacture of torque sensors which are intended to be used within a power steering device, on-board a motor vehicle, in order to measure the torque exerted by the driver on the steering wheel.

Generally, the measurement of the torque is made by measuring the elastic deformation of a torsion bar which is mounted between an input shaft, such as the upstream segment of a steering column, which carries the steering wheel, and an output shaft, such as the downstream segment of said steering column, which carries a pinion meshing on a steering rack.

In order to measure this torsional deformation, it is in particular known to use a torque sensor with magnetic technology.

Such a sensor usually comprises:
- a set of permanent magnets which are implanted on the input shaft according to an annular distribution, so as to present, about said input shaft, a succession of facets alternating north poles and south poles,
- a magnetic flux collector, which is carried by the output shaft and which includes two annular magnetic yokes which surround the magnet assembly, each yoke being provided with a succession of teeth which are placed opposite to the permanent magnets and which are distributed at the same angular pitch as the poles (North, respectively South poles) of said permanent magnets,
- a flux concentrator support, which is carried by a fixed torque sensor case, traversed by the input and output shafts and surrounding the flux collector, said flux concentrator support comprising two slip rings which are each placed opposite to one of the magnetic yokes, in order to be able to collect the magnetic flux which is generated by the magnets through said magnetic yokes, and finally
- Hall effect cells, fastened to the sensor case, which are placed in the air gap which axially separates the two slip rings, in order to measure said magnetic flux.

Thus, any deformation of the torsion bar under the effect of a torque results in a change of the angular position of the input shaft relative to the output shaft, and therefore by a change in the position of the magnets relative to the teeth of the magnetic yokes, which causes a polarization of said magnetic yokes (one of the yoke becoming a North Pole, while the other yoke becomes a South Pole) and consequently the appearance of a magnetic flux which is then measured by Hall effect cells.

In practice, the method for assembling the Hall effect cells within the sensor case should meet three requirements: firstly, ensuring a holding in strong place Hall effect cells in the air gap of the slip rings, secondly, guaranteeing the sealing, in particular the water-tightness, of said sensor case and thirdly, allowing the electrical connection of the torque sensor to an external electronic processing unit.

To this end, a first assembly method is known which consists in grouping the Hall effect cells and the associated connector technology (cables and external connector) on a common support, of the fastening plate type, which is then fastened by screwing on the sensor case.

The sealing of the assembly is then ensured by a seal, such as an O-ring seal, which is interposed and compressed between said fastening plate and the sensor case.

However, if such an assembly method certainly allows obtaining a particularly robust torque sensor, the number of parts required for the implementation of said method makes said method relatively complex and expensive.

Furthermore, the implementation of such an assembly method imposes meeting relatively severe manufacturing and assembly tolerances, because it should be possible to ensure a sufficient and reproducible degree of compression of the seal. However, such imperatives may be difficult to reconcile with mass production at low cost.

Finally, the presence of threaded inserts, of fastening screws, and of a dedicated fastening plate, tends to increase the space requirements and the weight of the torque sensor obtained accordingly.

In order to overcome the aforementioned drawbacks, it is also known to use another assembly method, according to which the Hall effect cells and the slip rings are embedded and, where appropriate, part of the connector technology associated to the Hall effect cells, during an overmolding operation, in the same resin block which constitutes at the same time part of or even the entire sensor case.

If such a fastening by overmolding solution allows obtaining a good sealing at low cost, it is, however, not totally without drawbacks.

Indeed, during the polymerization of the resin, and more particularly during the crosslinking of said resin, or even during the cooling of the resin if it is hot-injected, there is a shrinkage which creates mechanical stresses in the Hall effect cells, and where appropriate in the associated connector technology. This may be detrimental to the positioning accuracy of the Hall effect cells in the air gap, or to the service life of the torque sensor.

Moreover, when the resin is used to form a large-sized structural part, such that the sensor case, it is very much preferable, in order to limit the manufacturing costs and maximize the production rate, to use not a thermosetting resin, but rather a thermoplastic (generally fiber-reinforced) resin, allowing an injection molding.

However, when such a thermoplastic resin is injected under pressure and at high temperature (typically between 290° C. and 330° C.), the heat and pressure may damage the Hall effect cells.

Moreover, it may be difficult to predict and control the behavior of the liquid resin within the sensor case, during the overmolding.

Particularly, the liquid resin may tend to leave the target area of the air gap, for which it is normally intended, and to be insinuated into the sensor case, beyond the Hall effect cells and the air gap.

However, such a migration of the resin may cause the appearance of unwanted burrs in the sensor case, for example in the proximity of the slip rings, or on the contrary leave empty areas that the resin is supposed to fill, thereby creating air bubbles which are likely to weaken the assembly.

The higher the risk of appearance of air bubbles, and therefore the risk of appearance of weakening areas, on an automated production line, the more identical the amount of resin delivered to each overmolding cycle, while the migration of the resin may have a randomly variable nature, hardly predictable from one cycle to the next.

It is therefore in practice difficult to determine an appropriate dosage of the amount of resin, which guarantees at each cycle a supply of resin just necessary and sufficient to obtain a satisfactory mechanical fastening and a good sealing of the assembly.

The objects assigned to the invention therefore aim to remedy the aforementioned drawbacks and to propose a new method for manufacturing a torque sensor which is simple, inexpensive to implement, easily reproducible and well adapted to a mass production, while systematically guaranteeing the strength of the torque sensor as well as the sealing, in particular the water-tightness, of said torque sensor.

The objects assigned to the invention are achieved by means of a method for manufacturing a torque sensor comprising a step (a) of preparing a sensor case during which at least a first slip ring and a second slip ring, intended to collect a magnetic flux, are placed inside a sensor case, said slip rings being distant from each other and each carrying respectively at least a first measuring terminal and a second measuring terminal which delimit therebetween an air gap, a step (b) of producing a sensor beam during which a subassembly called «sensor beam» subassembly is produced, which comprises at least one Hall effect cell, intended to be placed in the air gap in order to measure the magnetic flux therein, as well as at least one electrical connection interface which is intended to allow an electrical connection between the Hall effect cell and a processing unit external to the sensor case, and an assembly step (c) during which the sensor beam is introduced into an access orifice, which passes through a wall of the sensor case to open on the air gap, so as to place the Hall effect cell in the air gap, then the sensor beam is fastened on the sensor case, said method being characterized in that, during the step (b) of producing the sensor beam, the sensor beam is equipped with an adapter which is arranged to cooperate with the access orifice of the sensor case so as to subdivide said access orifice into a first cavity called «preservation cavity», which opens on the air gap and which contains the Hall effect cell, and a second cavity, called «filling cavity», which communicates with the outside, and in that, during the assembly step (c), the sensor beam is fastened on the sensor case by overmolding, by casting a coating material of the resin type into the filling cavity in order to create a plug which links the sensor beam to the sensor case and closes the access orifice, while the adapter prevents said coating material from filling the preservation cavity and wetting the Hall effect cell.

Advantageously, the method according to the invention allows joining and embedding together, in the same strong and sealed (in particular liquid water-tight, water vapor-tight and lubricant-tight (lubricants of the oil or grease type)) one-piece coating material plug, the adapter, at least part of the sensor beam and part of the sensor case.

Advantageously, the addition of said adapter on the sensor beam also allows partitioning the sensor case, and more particularly partitioning the access orifice, so that, during the overmolding, the coating material from the outside is directed to and confined in the filling cavity, to form therein the aforementioned sealed plug, but it cannot reach the air gap nor, more particularly, cover all or part of the Hall effect cell, whose integrity is thus preserved.

Moreover, the volume of coating material required to seal the access orifice corresponds to the (free) volume of the filling cavity, as said volume is defined by construction during the placement of the adapter. Dosing the coating material is therefore perfectly controlled and identical from one torque sensor to the other.

Moreover, the adapter according to the invention not only allows accurately and reproducibly positioning the sensor beam in the sensor case, during the introduction of said sensor beam into the access orifice, but also firmly holding said sensor beam in the desired position before the overmolding as well as during the overmolding.

The method according to the invention thus allows accurately, reproducibly and stably placing the Hall effect cell in a desired position in the air gap, then holding the Hall effect cell in this desired position by avoiding any accidental displacement of said Hall effect cell relative to the air gap during a possible handling of the case before the filling as well as during the filling.

The preparation then the implementation of the filling by the coating material is therefore greatly facilitated.

Ultimately, the method according to the invention therefore allows bringing then fastening by overmolding the sensor beam in the sensor case in a simple and fast manner perfectly compatible with an automation required by a mass production.

Moreover, this same method guarantees both robust and perfectly sealed fastening of the sensor beam onto the sensor case, while remaining particularly coating material-saving.

Other objects, features and advantages of the invention will appear in more detail upon reading the following description, as well as using the appended drawings, provided for purely illustrative and non-limiting purposes, among which:

FIG. 1 illustrates, according to an exploded perspective schematic view, the constituent members of a torque sensor with magnetic technology that may be manufactured according to the method in accordance with the invention.

FIG. 2 illustrates, according to a longitudinal sectional view, in a section plane containing the main axis of rotation of the shaft on which the torque is measured, the placement of a sensor beam according to the invention within a sensor case, before the fastening by overmolding, and in accordance with a first variant of the invention, according to which the sheath of the sensor beam is bent so as to extend substantially parallel to the main axis of the shaft.

FIG. 3 illustrates, according to a detailed view in the same section plane as FIG. 2, the torque sensor of FIG. 2 obtained after overmolding, within which the coating material cast into the filling cavity ensures the fastening of the sensor beam in the sensor case.

FIG. 4 corresponds to the assembly of FIG. 2, seen in transverse section, in a section plane orthogonal to the axis of the shaft.

FIG. 5 corresponds to the assembly of FIG. 3, after overmolding, seen in transverse section in the same section plane as FIG. 4.

FIG. 6 shows, according to an exploded perspective view, the sensor beam, its adapter, and the sensor case according to the first variant of FIGS. 2 to 5.

FIG. 7 illustrates the detail of the section of the sensor case used to retain the bent sheath of the sensor beam along the sensor case, within the first variant of FIGS. 2 to 6.

FIG. 8 illustrates, according to a perspective detailed view, the distal end of the sensor beam of FIG. 6, provided with its adapter, in the assembled configuration.

Figure 9:
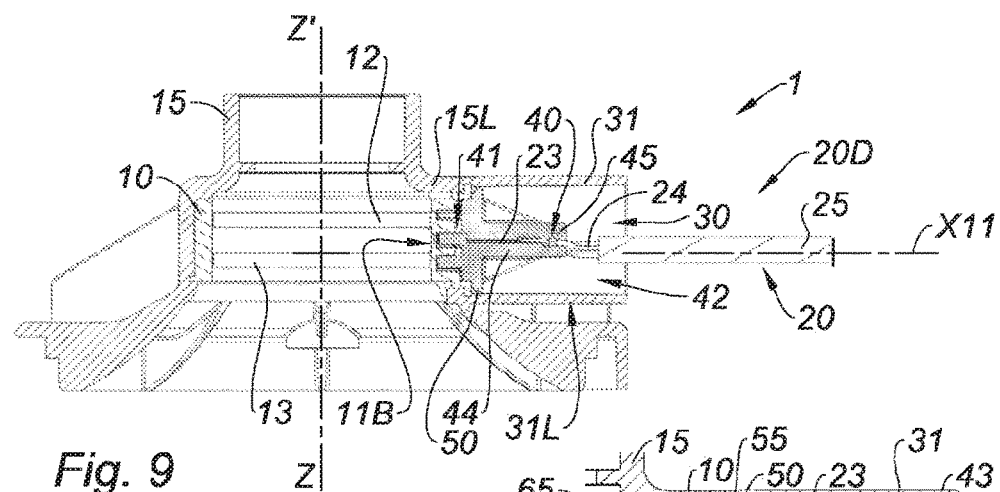
FIG. 9 illustrates, according to a longitudinal sectional view, before casting the coating material into the filling cavity, a second variant of the invention, according to which the sheath of the sensor beam is straight so as to extend substantially perpendicular to the main axis of the shaft.
Figure 11:
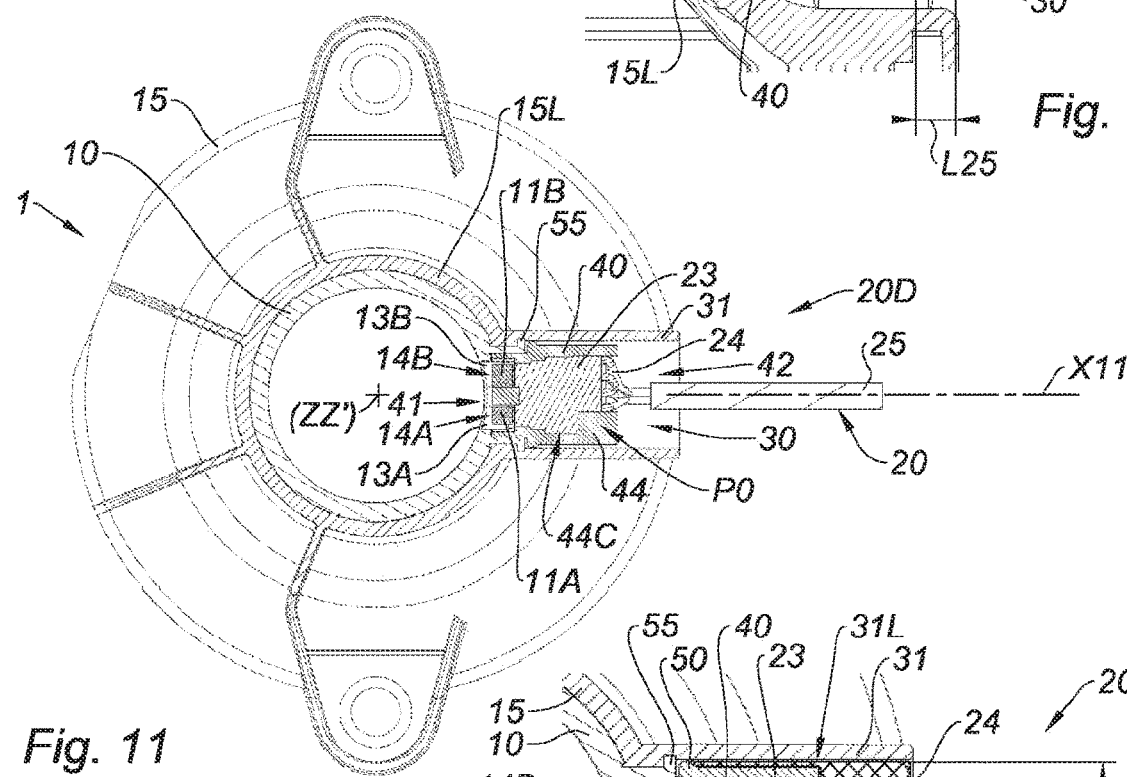

FIG. 11 corresponds to the assembly of FIG. 9, seen in transverse section, in a section plane orthogonal to the main axis of the shaft.

Figure 10:
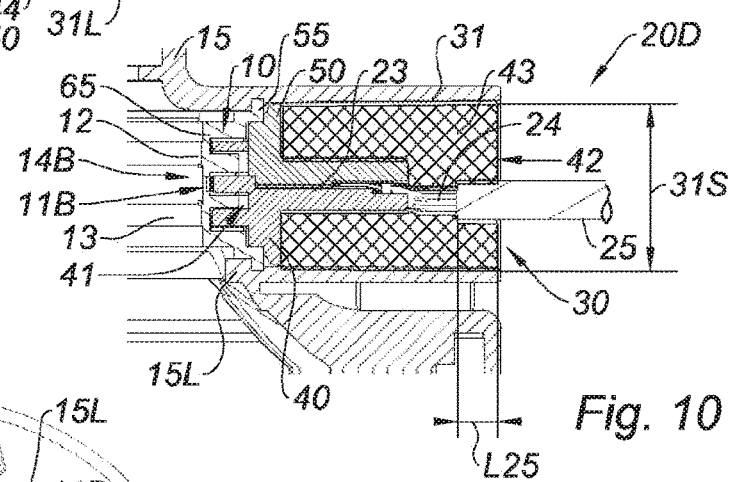
FIG. 10 illustrates, according to a detailed view, the result of the overmolding allowing the fastening of the sensor beam within the second variant of FIG. 9.
Figure 12:
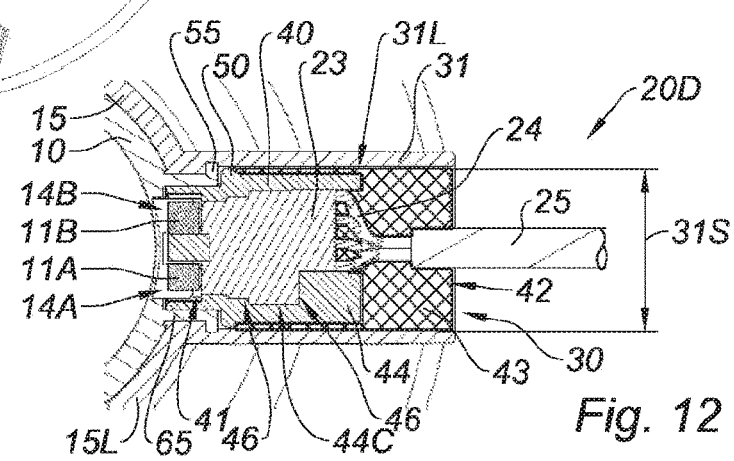

FIG. 12 corresponds to the assembly of FIG. 10, after overmolding, seen in transverse section in the same section plane as FIG. 11.

Figure 13:
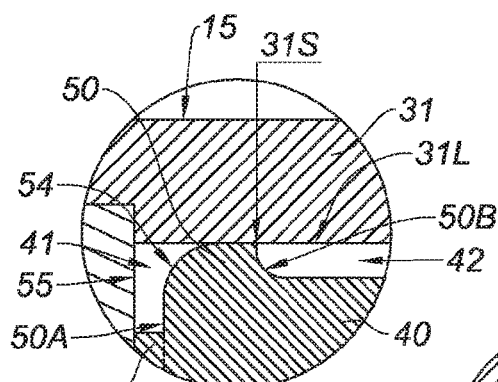
Figure 14:
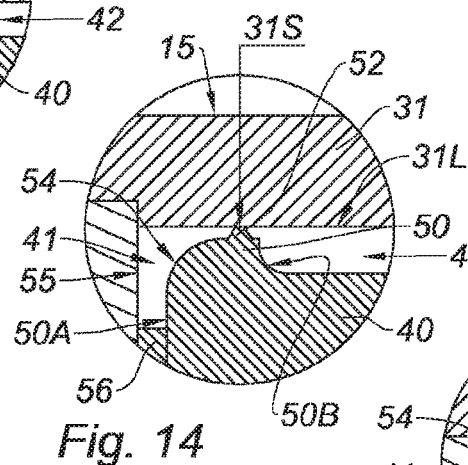
Figure 15:
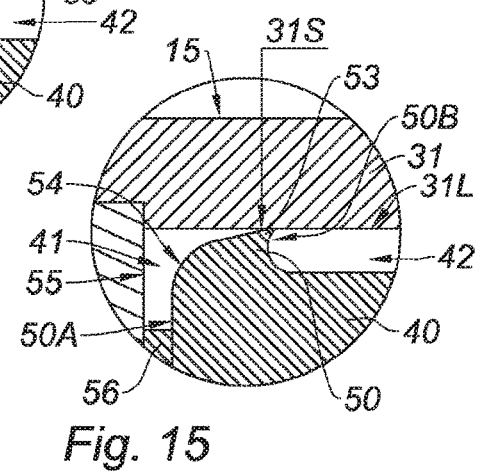

FIGS. 13, 14 and 15 show, according to longitudinal sectional detailed views, different variants of adapters provided with collars which allow carrying out a tight nesting of said adapters into the access orifice of the sensor case, in coating material-tight manner.

Figure 16:
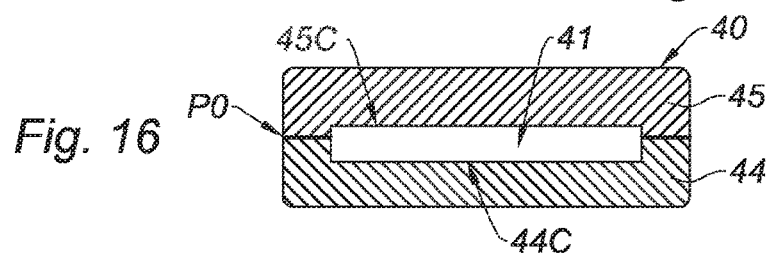
Figure 17:
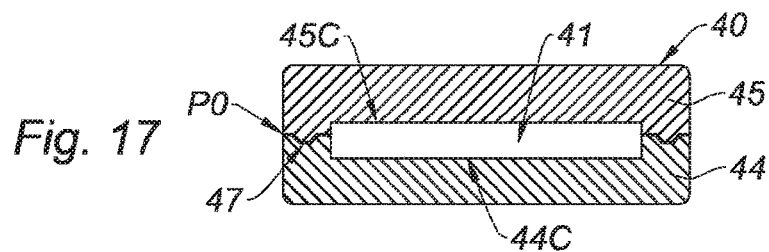
Figure 18:
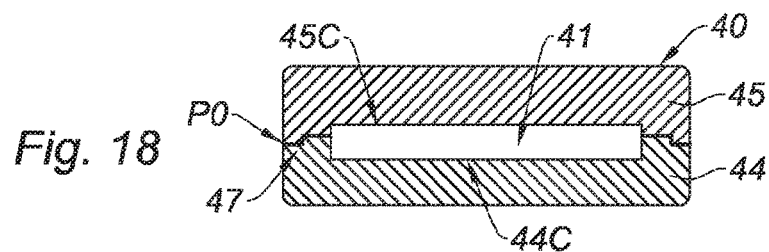

FIGS. 16, 17 and 18 show, according to sectional views, different arrangement variants of the parting line according to which a first shell part and a second shell part are assembled to form an adapter according to the invention, and more particularly an adapter as that used in FIGS. 6, 8 and 10.

The present invention concerns a method for manufacturing a torque sensor 1.

Therefore, it also naturally concerns as such a torque sensor 1 obtained by such a method.

In a manner known per se, and as illustrated in FIG. 1, the torque sensor 1 allows measuring a torque T0 exerted on a shaft 2, 3, for example a motor vehicle steering column, typically within a power steering system.

Said shaft 2, 3 comprises, on the one hand, an upstream shaft portion 2, which forms an input shaft 2, and which preferably corresponds to an upstream portion of the steering column carrying a steering wheel 4 and, on the other hand, a downstream shaft portion 3, which forms an output shaft 3, preferably coaxial with the input shaft 2, and which typically corresponds to a downstream portion of the steering column, carrying a pinion which meshes with a steering rack (not shown).

The term «main axis» (ZZ') will be designated for the axis of rotation of the shaft 2, 3, that is to say the longitudinal axis common to the input shaft 2 and to the output shaft 3.

By simple convention and convenience of description, the term «axial» may be qualified for a direction or a measurement considered parallel to said main axis (ZZ'), and the term «radial» may be qualified for a direction or a measurement considered substantially perpendicular to said main axis (ZZ').

The input shaft 2 is connected to the output shaft 3 by an elastically deformable member 5, such as a torsion bar 5, whose degree of deformation depends on the intensity of the applied torque T0 (which is to be measured).

As mentioned above in the introduction, the torque sensor 1 comprises a set of permanent magnets 6 secured to the input shaft 2 and which alternate North poles (N) and South poles (S) about the main axis (ZZ').

The torque sensor 1 also comprises a magnetic flux collector 7, secured to the output shaft 3, and intended to collect the magnetic flux generated by the permanent magnets 6.

To this end, said flux collector 7 includes a first magnetic yoke 8 and a second magnetic yoke 9, which are annular, centered on the main axis (ZZ'), and which each surround the set of permanent magnets 6.

Said magnetic yokes 8, 9 are each provided with a series of teeth 8T, respectively 9T, here triangular and interlocked, opposite to which the magnets 6 are placed when the input shaft 2 is located inside the flux collector 7, such that the (North or South) polarity of each yoke 8, 9 depends on the average polarity of the set of the magnet poles 6 in front of which its teeth 8T, 9T are located.

The torque sensor 1 further comprises a flux concentrator support 10 intended to capture the magnetic flux collected by the yokes 8, 9 of the flux collector 7, and to concentrate said magnetic flux to direct it towards one or more detection cell(s) 11A, 11B, here Hall effect cells 11A, 11B, which will allow measuring the features of said magnetic flux, namely typically the sign (direction) and the intensity of said magnetic flux.

To this end, the flux concentrator support 10 comprises at least a first slip ring 12 and a second slip ring 13, which are annular, centered on the main axis (ZZ'), axially separated from each other and each made of a ferromagnetic material.

The first slip ring 12 is located axially (along the main axis (ZZ')) opposite to the first magnetic yoke 8 so as to surround it (from the outside).

Similarly, the second slip ring 13, distinct and axially distant from the first slip ring 12, is located axially opposite to the second magnetic yoke 9 it surrounds.

Each slip ring 12, 13 advantageously carries at least one measuring terminal 12A, 13A, and preferably two measuring terminals 12A, 12B, respectively 13A, 13B.

Each measuring terminal 12A, 12B of the first slip ring 12 delimits, with the corresponding measuring terminal 13A, 13B of the second slip ring 13, an (axial) air gap 14A, 14B.

A detection cell (Hall effect cell) 11A, 11B is placed in each air gap 14A, 14B to measure therein the magnetic flux between the corresponding measuring terminals 12A, 13A, 12B, 13B.

Initially, in the absence of a deformation torque T0, each tooth 8T, 9T overlaps in equal parts a North face N of a magnet 6 and a South face S of the neighboring magnet 6, so that each magnetic yoke 8, 9 has an identical and neutral resulting polarization. No magnetic flux is therefore created between the slip rings 12, 13.

However, when a torque T0 deforms the torsion bar 5, it modifies the angular position of the input shaft 2 relative to the output shaft 3, and consequently offsets the permanent magnets 6 relative to the respective teeth 8T, 9T of the two magnetic yokes 8, 9, such that the teeth 8T of the first yoke are all mainly exposed to poles corresponding to a first (for example North) polarity, so that the first magnetic yoke 8 acquires said first (here North) polarity, while the teeth 9T of the other yoke 9 are all mainly exposed to poles of opposite (South) polarity, so that the second magnetic yoke 9 acquires a polarity opposite to that of the first yoke 8.

The polarization of the magnetic yokes 8, 9 thus gives rise to a magnetic flux which is captured by the slip rings 12, 13 and conveyed to the air gap 14A, 14B where it is measured.

Advantageously, and as schematized with dotted lines in FIG. 2, the input shaft 2, the set of permanent magnets 6, the torsion bar 5, as well as the output shaft 3 and the flux collector 7 carried by the latter are rotatably mounted in a sensor case 15, in which the flux concentrator support 10 as well as the Hall effect cells 11A, 11B are moreover fastened.

Said sensor case 15 thus forms a cylindrical envelope about the main axis (ZZ') which passes therethrough, and advantageously offers the different aforementioned members a sealed protection against the water vapor, the salt spray, the liquid foreign bodies (water, external lubricants, fuel . . . ) and the solid foreign bodies (dust, gravel . . . ).

The sensor case 15 might be made of a metal material, such as a steel or an aluminum or magnesium-based light alloy or, particularly preferably, of a rigid polymeric, preferably thermoplastic, material such as a polyamide (PA), an aromatic polyamide of the polyphthalamide (PPA) type, a polybutylene terephthalate (PBT) or a polyphenyl sulfone (PPS).

Said polymer might advantageously be reinforced with fibers, such as glass, aramid, carbon fibers, or a combination of at least two of these fibers.

As indicated above, the use of a thermoplastic polymer will allow manufacturing a lightweight sensor case 15 at low cost and at high rates, by hot injection molding.

According to the invention, the method for manufacturing the torque sensor 1 comprises a step (a) of preparing a sensor case 15 during which are placed inside a sensor case 15, as illustrated in FIGS. 2, 4, 9 and 11, at least a first slip ring 12 and a second slip ring 13 which are intended to collect a magnetic flux (created by the polarization of the magnetic yokes 8, 9 of the flux collector 7, depending on the azimuthal angular position of the permanent magnets 6, as explained above).

As previously indicated, said slip rings 12, 13 are (axially) distant from each other and each carry respectively at least a first measuring terminal 12A, 12B (belonging to the first slip ring 12) and a second measuring terminal 13A, 13B (belonging to the second slip ring 13) which delimit an air gap 14A, 14B therebetween.

Moreover, the method according to the invention also comprises a step (b) of producing a sensor beam 20 during which a subassembly called «sensor beam» subassembly 20 is produced which comprises, an in particular shown in FIGS. 1, 2 and 6, at least one Hall effect cell 11A, 11B, intended to be placed in the air gap 14A, 14B, in order to measure therein the magnetic flux, as well as at least one electrical connection interface 21 which is intended to allow an electrical connection between the Hall effect cell 11A, 11B and a processing unit 22 external to the sensor case 15.

Preferably, the sensor beam 20 will comprise two separate Hall effect cells 11A, 11B and arranged to measure each (and simultaneously) the magnetic flux in a distinct air gap 14A, 14B.

Such redundancy of the Hall effect cells 11A, 11B, provided for safety, allows in particular maintaining the functionality of the torque sensor 1 in case of failure of one of said two Hall effect cells.

The processing unit 22 may in turn correspond to any on-board computer on the vehicle, and preferably to a steering computer which is integrated with the steering system of the vehicle to manage the steering assistance.

Preferably, the connection interface 21 of the sensor beam 20 comprises, as clearly shown in FIGS. 1 to 6 and 9 to 12, an acquisition electronic circuit 23 to which the at least one Hall effect cell 11A, 11B is connected and which serves as a support for said at least one Hall effect cell 11A, 11B.

Said acquisition electronic circuit 23 will be preferably in the form of a rigid (or semi-rigid) board, of the printed circuit type, forming an electronic card 23 on which the at least one Hall effect cell 11A, 11B will be fastened, and for example welded.

It will be noted that the Hall effect cell(s) 11A, 11B will be preferably disposed protruding from the edge of said electronic card 23, so as to be easily introduced into their respective air gap 14A, 14B, without said electronic card 23 disturbing the magnetic flux to be measured.

In absolute terms, the acquisition electronic circuit 23 (internal to the sensor case 15) might be designed so as to allow a remote communication, by radio waves, that is to say a wireless connection, with the processing unit 22 (external to the sensor case 15).

However, particularly preferably, and in particular in order to improve the reliability and the accuracy of the measurement of the torque T0, but also to increase the robustness of the torque sensor 1 and more generally of the power steering system, the connection between the Hall effect cells 11A,11B (internal to the sensor case 15) and the processing unit 22 (external to said sensor case 15) will be ensured by wire.

To this end, preferably, and as illustrated in particular in FIGS. 1 to 6 and 9 to 12, the sensor beam 20 comprises, at one of its ends called «distal end» 20D, intended to be introduced and embedded in the sensor case 15, an acquisition electronic circuit 23 which carries the (at least one) Hall effect cell 11A, 11B, as well as a plurality of electric cables 24 which are grouped in a sheath 25 and which link said acquisition electronic circuit 23 to a remote connector 26, located at the opposite end of the sensor beam, called «proximal end» 20P.

The connector 26 advantageously allows a reversible hardware connection of the sensor beam 20 to the (external) processing unit 22, as schematized in FIG. 1, and thus ensures the versatility and interchangeability of the torque sensor 1.

The electric cables 24, which start from the acquisition circuit 23, at which they are welded to the printed circuit, to join the pins of the connector 26, are preferably four, at a rate of two cables 24 per Hall effect cell 11A, 11B.

It should be noted that the arrangement of the sensor beam 20, and more particularly the arrangement of the sheath 25, may be subject to variations without departing from the scope of the invention.

Thus, according to a first variant, corresponding to FIGS. 2 to 8, the sheath 25 has a bent outlet, which allows said sheath 25 to extend along the wall 15L of the sensor case 15, here substantially parallel to the main axis (ZZ'), and more particularly substantially perpendicular to the direction of insertion, noted X11, in which the Hall effect cells 11A, 11B are engaged in the air gap 14A, 14B.

To this end, the cables 24 form an angle (here substantially of 90 degrees) relative to the acquisition electronic circuit 23.

Such a first variant with a bent outlet allows, in particular, improving the pull-out resistance of the sensor beam 20.

Particularly, according to such a first variant, the angle, that is to say the curved portion of the electric cables 24 and/or of the sheath 25, which allows reconciling a radial outlet of said cables 24, in the direction of insertion X11, with an axial redirection of said sheath 25 along the wall 15L of the sensor case 15, here downwards, is advantageously embedded in the coating material 43 (as will be detailed below).

This avoids thus the need to form said angle in the form of an apparent loop of cable 24 and sheath 25 which would then be exposed and vulnerable to a possible, voluntary or accidental, traction likely to cause a pull-out or a damage of the sensor beam 20.

According to a second variant, corresponding to FIGS. 9 to 12, the sheath 25 has a straight outlet, which allows said sheath to extend substantially perpendicularly to the main axis (ZZ'), that is to say substantially radially, transversely to the wall of the sensor case 15, and more particularly here substantially parallel to the direction of insertion X11 of the Hall effect cells, in the extension of the acquisition electronic circuit 23.

Then, the cables 24 will preferably form a substantially rectilinear bridge between said acquisition electronic circuit 23 and the sheath 25.

Such a second variant allows in particular simplifying the structure of the sensor case 15 at the outlet of the sheath 25, and improving the (axial) compactness of the torque sensor 1.

Moreover, it will be noted that, whatever the considered variant, with straight outlet or bent outlet, it is possible to use an identical sensor beam 20, which contributes to the standardization of the manufacture.

Indeed, it is simply sufficient to give the electrical cables 24, which are inherently flexible, the desired shape (straight or bent) during the placement of the sensor beam 20 in the sensor case 15.

Of course, the method according to the invention comprises an assembly step (c) during which the sensor beam 20 is introduced into an access orifice 30, which passes through a wall 15L of the sensor case 15 to open on the air gap 14A, 14B, so as to place the (at least one) Hall effect cell 11A, 11B in the air gap, then the sensor beam 20 is fastened on the sensor case 15.

In a particularly preferred manner, and as illustrated in FIGS. 2, 4, 6, 9 and 11, the introduction of the sensor beam 20 into the sensor case 15 is made by lateral approach, through a lateral wall 15L of the sensor case 15 which surrounds the main axis (ZZ'), and by following a substantially radial centripetal direction of insertion X11.

Such an approaching and centripetal radial penetration movement, directed towards the main axis (ZZ') substantially perpendicularly to said main axis, allows a quick and simple placement of the distal end 20D of the sensor beam 20 within the sensor case 15, directly between the slip rings 12, 13 (and more particularly between the terminals 12A, 13A, 12B, 13B of said slip rings).

It will be noted that, in particular for convenience of manufacturing, but also because it is preferable to place the slip rings 12, 13 as close as possible to the magnetic yokes 8, 9, the access orifice 30 will preferably directly open onto the central chamber of the sensor case 15, which is traversed by, and accommodates, the input 2 and output 3 shafts, that is to say said access orifice 30 will pass through the lateral wall 15L of the sensor case 15 from side to side.

Preferably, the access orifice 30 forms a sleeve 31.

Said sleeve 31 is preferably formed in one single piece with the sensor case 15, for example during the manufacture by molding of said sensor case 15.

Said cylindrical sleeve 31 preferably has a circular passage section 31S, and its central generator (here rectilinear) axis advantageously corresponds to the direction of insertion X11.

Of course, the passage section 31S of the cylindrical sleeve 31 might have any shape adapted to the number and the spatial arrangement of the Hall effect probes 11A, 11B and to the shape of the acquisition circuit 23.

Thus, it would be possible, in particular, without departing from the scope of the invention, to use an oval, ovoid, or multi-lobed passage section 31S, for example in the form of a bean (with two lobes), in particular if using four Hall effect cells is being considered.

Such a sleeve 31, which initially puts the inside of the sensor case 15 in communication with the outside of said sensor case 15, advantageously provides, on the one hand, a guide which facilitates the insertion and the centering of the sensor beam 20 during its introduction into said sensor case and, on the second hand, a chamber (called «filling cavity») with the relatively large volume which will allow the formation of a strong and sealed fastening plug by overmolding.

According to the invention, and as clearly seen in FIGS. 2, 4, 6, 8, 9 and 11, during the step (b) of producing the sensor beam, the sensor beam 20 is equipped with an adapter 40 which is arranged to cooperate with the access orifice 30 of the sensor case 15 (and more particularly with the wall of the sleeve 31) so as to subdivide said access orifice 30 into a first cavity called «preservation cavity» 41, which opens on the air gap 14A, 14B and which contains (or is intended to contain) the Hall effect cell(s) 11A, 11B, and a second cavity, called «filling cavity» 42, which communicates with the outside (that is to say which opens onto the external environment of the sensor case 15).

Then, during the assembly step (c), the sensor beam 20 is fastened on the sensor case 15, and more particularly inside the sleeve 31, by overmolding, by casting a coating material 43 of the resin type into the filling cavity 42 in order to create, as illustrated in FIGS. 3, 5, 10 and 12, a plug which links the sensor beam 20 to the sensor case 15 and which closes the access orifice 30, while the adapter 40 prevents said coating material 43 from filling the preservation cavity 41 and wetting the Hall effect cell(s) 11A, 11B.

The plug being constituted of the coating material 43, after solidification of said coating material 43 in the filling cavity 42, it is possible, by simple convenience of notation, to use the same reference 43 to designate the plug or the coating material.

Advantageously, the distal end 20D of the sensor beam 20, and more particularly the adapter 40 carried by said distal end, as well as the cables 24 and a corresponding end portion of the sheath 25, are thus embedded in the coating material 43, which also adheres to the wall 15L of the sensor case 15 which it fills and seals the access orifice 30, which guarantees both robust and sealed fastening of the sensor beam 20 on the sensor case 15.

The used coating material 43 will be preferably a thermosetting polymer, which may be cast in the liquid state, where appropriate at ambient temperature, and at low pressure or even at atmospheric pressure.

Such a thermosetting material flows easily indeed under low pressure, and further has good adhesion capacities to the sensor case 15 and to the sheath 25, as well as a long service life.

In this regard, it will be noted that the invention advantageously offers the possibility of producing a torque sensor 1 which comprises, on the one hand, a sensor case 15 obtained at a low cost by hot injection molding of a thermoplastic polymer and, on the other hand, a plug 43 made of a thermosetting polymer, the use of such a thermosetting polymer, particularly strong and sealed but more expensive than the thermoplastic polymer, being then reserved to the only coating material 43.

For example, a polyurethane resin (PU), an epoxy resin (EP) or, possibly, a silicone resin (SI) might be chosen as a thermosetting coating material 43.

However, it is not excluded to use, as a coating material 43, a thermoplastic resin of the adhesive type, for example a polyethylene, a polypropylene, a polyamide or, preferably, an «EVA» (ethylene-vinyl acetate) copolymer.

Such thermoplastic adhesives have in particular the advantage of being easy to implement and to be recyclable.

However, the thermosetting resins have, a priori, a better durability in terms of sealing of the obtained connection, in particular in an environment where the temperature is high (as it is the case when the sensor 1 is in the vicinity of a combustion engine), or in a humid environment.

Instead, the use of thermoplastic resins («adhesives») will be reserved for torque sensors 1 which are intended for electric vehicles (and which are therefore subjected to heating less than that of the thermal vehicles), and/or to rear-engine vehicles, within which the torque sensor 1, located at the front, out of the engine compartment, is not exposed to heat emissions of the engine.

Moreover, regardless of the type of resin retained as coating material 43, it will be preferably ensured that said coating material 43 has (once solidified) a hardness greater than or equal to 50 Shore D1, and this in order to oppose sufficient pull-out resistance.

To this end, the coating material 43 will be preferably crosslinked.

Furthermore, particularly preferably, the coating material 43 will be a thixotropic polymer, that is to say that its viscosity (in the liquid state) is reduced when a stress is applied thereto.

Advantageously, the thixotropy will allow the coating material 43 to have a relatively low viscosity during the casting, so that said coating material 43 easily and effectively fills the filling cavity 42, and coats the sensor beam 20 by covering at least partially the adapter 40, while preventing said filling material 43, which tends to be spontaneously restructured in the absence of stress, from seeping into too narrow spaces.

Particularly, this property of thixotropy will prevent the coating material 43 from bypassing the adapter 40, or from being infiltrated into said adapter 40, and therefore will prevent said coating material 43 from entering the preservation cavity 41, and more particularly reaching the air gap 14A, 14B, the slip rings 12, 13, and Hall effect cells 11A, 11B.

The different examples of thermosetting resins and thermoplastic resins mentioned above advantageously have a thixotropic nature.

Ultimately, the preservation cavity 41 being isolated from the coating material 43 by the adapter 40 during the casting, then isolated from the environment of the sensor 1 by the plug made of coating material 43, no external foreign body, and in particular no burr of coating material 43, nor any water infiltration will therefore disturb the collection, by the slip rings 12, 13, then the measurement, by the Hall effect cell(s) 11A, 11B, of the magnetic flux, generated by the magnets 6, which comes from inside the torque case 15.

It will be noted that the adapter 40 is advantageously integrated to the sensor beam 20, before insertion of the distal end 20D of said beam 20 into the access orifice 30, and that said adapter 40 is found caught in the coating material plug 43, to be left permanently (forever) in the torque case 15.

Of course, said adapter 40 might have any suitable shape, preferably substantially complementary to that of the sleeve 31, so as to be able to partition the access orifice 30 in a liquid coating material-tight manner 43, and thus form, in cooperation with the sensor case 15, a sealed barrier between the preservation cavity 41, which contains and protects the area of the air gap 14A, 14B, and which is therefore left devoid of coating material 43, and the filling cavity 42 which receives and contains a perfectly predetermined volume of said coating material 43.

It will be also noted that the same model of adapter 40 can advantageously be used, in an identical manner, for the assembly of the variant with bent outlet (FIGS. 2 to 8) as well as for the assembly of the variant with straight outlet (FIGS. 9 to 12), which allows a standardization of the manufacture.

Preferably, as clearly seen in FIGS. 6 and 8, the adapter 40 is formed by a shell 44, 45 which is obtained by closing on each other, about a segment of the sensor beam 20, and more particularly about a segment of the distal end 20D of said sensor beam 20, at least a first shell part 44 and a second shell part 45, so as to encapsulate said sensor beam segment 20.

Advantageously, the use of a shell fractionated into shell parts 44, 45 simplifies the positioning and assembly of the adapter 40 on the sensor beam 20, since it is sufficient to bring said shell parts 44, 45 against each other, according to a parting line P0, by operating an approximation movement which is transverse to the (longitudinal) average line of the considered sensor beam segment 20, so as to sandwich said sensor beam segment.

Furthermore, the use of a shell 44, 45 allows easily creating a sealed separation between the external apparent face of said shell 44, 45, which will be covered by the coating material 43, and the inner imprint 44C, 45C of the shell, an imprint which may form at least one part of the preservation cavity 41, and therefore which might accommodate the air gap 14A, 14B and the Hall effect cells 11A, 11B.

Preferably, and in particular for convenience of manufacturing, the shell 44, 45 consists of only two shell parts 44, 45 complementary to each other.

The shell parts 44, 45 will be preferably joined in a parting line P0 which splits the shell in two substantially parallel to the average line of the sensor beam segment, each shell part 44, 45 covering preferably substantially half of the perimeter of the sensor beam 20 (namely about 180 degrees about the average line of said beam).

Preferably, said parting line P0 will be substantially orthogonal to the main axis (ZZ'), thus subdividing the shell 44, 45 into a lower half-shell 44 and an upper half-shell 45.

The shell parts 44, 45, and more generally the adapter 40, are preferably formed in a rigid polymeric material, such as a polybutylene terephthalate, preferably filled (for example a PBT MD30 containing 30% of mineral fillers or a PBT GF30 containing 30% of glass fibers).

Preferably, and as clearly shown in FIGS. 4, 6 and 11, the inside of the shell 44, 45 has an imprint 44C, 45C of a shape substantially mating the shape of the sensor beam segment 20 intended to receive the adapter (40), such that, once the shell 44, 45 is closed on the sensor beam, the sensor beam 20 is automatically held in a fixed and predetermined position inside the adapter 40 (the sensor beam 20 thus being substantially held in a fixed and predetermined position relative to said adapter 40, and vice versa).

Such an arrangement will advantageously allow a unique, reproducible and stable positioning of the shell 44, 45, and therefore of the adapter 40, on the sensor beam 20 being thus trapped in the shell 44, 45.

A possible residual clearance (in this case the thickness clearance) between the shell 44, 45 and the sensor beam segment 20 contained in said shell, and more particularly between the imprint 44C, 45C and said sensor beam segment 20, will be preferably at least in the portion(s) where the sensor beam is most close to the bottom of the imprint 44C, 45C, less than or equal to 0.15 mm, and for example comprised between 0.05 mm and 0.15 mm if a «loose» holding is desired or even substantially zero if a tight holding by pinching is desired.

In all cases, said clearance will be sufficiently low, on the one hand, to ensure an effective holding of the adapter 40 on the sensor beam 20, before the introduction of the beam 20 into the access orifice 30 and during the overmolding, and on the other hand, to impede any penetration of the coating material 43 into the preservation cavity 41, by preventing, by thixotropic blocking, said liquid coating material 43 from getting into the preservation cavity 41 by passing through the inside of the shell 44, 45, between the sensor beam 20 and the imprint 44C, 45C.

In a particularly preferred manner, the connection interface 21 comprising an acquisition electronic circuit 23 as described above, the imprint of the shell 44C, 45C engages on said acquisition circuit 23 in order to ensure the positioning and holding of the sensor beam 20 in the adapter 40.

Advantageously, the imprint 44C, 45C thus has a shape substantially mating the contours of said acquisition circuit 23, and in particular substantially mating the cutting of the lateral edges of the printed circuit board which forms said acquisition circuit 23 and which is housed in the hollow of said imprint 44C, 45C.

Such an arrangement promotes a unique and reproducible positioning of the adapter 40 on the sensor beam 20, as well as a particularly effective holding of said adapter 40 on said beam 20.

As such, it will be noted that the imprint 44C, 45C and the acquisition circuit 23 (in particular the thin lateral edges of the printed circuit) may have, as clearly shown in FIGS. 5 and 12, one or more recess(es) 46 forming shoulders or indentations which advantageously prevent any relative sliding of the adapter 40 along the sensor beam 20 (or conversely).

Preferably, in order to facilitate the placement of the acquisition circuit 23 within the imprint 44C, 45C, but also to gain in (axial) compactness and robustness of assembly, the parting line P0 of the shell parts 44, 45, on which said imprint 44C, 45C opens, will be substantially parallel to the main surfaces (large surfaces, here the upper and lower surfaces in FIGS. 2 and 9) of the printed circuit board, or even coincident with one of said main surfaces, or coincident with the average extension plane of the acquisition circuit 23 comprised between said surfaces.

Thus, the plate forming the acquisition circuit 23 will be preferably disposed orthogonal to the main axis (ZZ'), substantially flat between the two shell parts 44, 45, such that the thickness of the acquisition circuit 23 extends along said main axis (ZZ').

As indicated above, the acquisition circuit 23 might be, at least before overmolding, tightly mounted (by flat pinching between the shell parts 44, 45) or on the contrary «loosely» retained but with a very weak clearance, in particular a very small thickness clearance (less than 0.15 mm).

It will be noted that, advantageously, the fact that the adapter 40 is engaged on a relatively strong and rigid element of the sensor beam 20, namely the acquisition circuit 23 (and more particularly the printed circuit board thereof), which does not fear being altered by the contact of the adapter or by the compression exerted by said adapter 40, which also offers a relatively wide bearing surface, allows a particularly strong and reliable fastening of the adapter 40 to the sensor beam 20.

Preferably, and as illustrated in particular in FIG. 8, the first and second shell parts 44, 45 are assembled against each other on the sensor beam segment 20 according to a parting line P0 along which the assembly clearance JA between the first shell part 44 and the second shell part 45 is less than or equal to 0.15 mm, and for example substantially comprised between 0.05 mm and 0.15 mm, so as to impede the penetration of the coating material inside the shell 44, 45.

As indicated above, by limiting the width (here the thickness) of any possible residual interstices between the two shell parts 44, 45 before the overmolding, a thixotropic blocking of the coating material 43 is created in order to prevent the latter from gaining the preservation cavity 41 by passing through the shell 44, 45 of the adapter 40.

In order to improve the sealing of the junction between the shell parts 44, 45 to the coating material 43, it is also possible to provide the parting line P0 with baffles 47, in particular with an oblique V-shaped pattern (FIG. 17) or a slotted perpendicular pattern (FIG. 18).

Preferably, the first and second shell parts 44, 45 are closed on each other and held in a closed position against each other by forced nesting, of the crimping or clipping type.

Advantageously, it will thus be possible to make a simple and rapid closure of the shell 44, 45, and therefore of the adapter 40, on the sensor beam 20, prior to the insertion into the access orifice 30, and therefore before the overmolding.

In order to allow such a fastening, it will be possible to use any type of adapted retaining member 48, and preferably formed integrally with one or both of the shell parts 44, 45, such as flexible tabs with hooks, pins protruding relative to the parting line P0 and penetrating with radial clamping in holes of mating diameters (as illustrated in FIGS. 5 and 6), etc.

Advantageously, this pre-fastening by tight nesting allows holding the shell 44, 45, and therefore the adapter 40, in (fixed) place on the sensor beam 20, before and during the overmolding, and authorizes in particular the manipulation of the sensor beam 20 out of the sensor case 15 and then the insertion of said sensor beam 20 out of the access orifice 30 of said sensor case 15, without any risk of disengagement or modification of the position of the adapter 40 relative to the sensor beam 20 (and in particular relative to the Hall effect cells 11A, 11B and relative to the sheath 25).

In a particularly advantageous manner, the adapter 40, which is brought onto the sensor beam 20 in a predetermined position, and therefore according to a unique and well-controlled configuration relative to the Hall effect cells 11A, 11B, may thus serve as a positioning marker during the introduction of the sensor beam 20 into the access orifice 30, so that a proper positioning of said adapter 40 within the access orifice 30 automatically guarantees a proper positioning of the Hall effect cells 11A, 11B within the air gap 14A, 14B.

Moreover, it will be noted that the fastening of the first shell part 44 on the second shell part 45, about the sensor beam 20, is advantageously reinforced once the adapter 40, and more particularly said shell parts 44, 45, are embedded, inside the sensor case 15 in the same coating material plug 43, which surrounds and wraps said two shell parts 44, 45 together.

Preferably, the sleeve 31 formed by the access orifice 30 has at least one passage section 31S which is laterally delimited by a lateral wall 31L forming a closed contour (about the direction of insertion X11, that is to say about the central generator axis of the sleeve 31).

As is in particular illustrated in FIGS. 3, 5, 8, 10 and 12 to 15, the adapter 40 may then advantageously be provided with a collar 50 which has a shape mating said at least one passage section 31S as well as initial dimensions (here, in the case of revolution shapes, an initial diameter) slightly larger than the dimensions (here, the diameter) of said passage section 31S, so that, upon the introduction of the sensor beam 20 and of the adapter 40 into the access orifice 30, the edge of said collar 50 is conformed, with interference, to the lateral wall 31L of the access orifice 30 (lateral wall 31L of the sleeve 31), over the entire closed contour of the passage section 31S, so that said collar 50, on the one hand, ensures a temporary holding in position (in particular anti-pull-out) of the adapter 40 and of the sensor beam 20 in the sensor case 15, by tight nesting, while waiting for the overmolding (FIGS. 4, 9 and 11) and, on the other hand, forms a bottom wall (or «yoke») of the filling cavity 42, which bottom wall cooperates with the lateral wall 31L of the access orifice 30 to form a sealed link against the flow of the coating material 43, and which thus allows containing, during the overmolding, said coating material 43 on the side of the access orifice 30 which is open outwards, that is to say on the side of the filling cavity 42, and more particularly on the side of the opening, common to the access orifice 30 and to the filling cavity 42, by which the beam 20 and the adapter 40 have been introduced into the sensor case 15 (FIGS. 3, 5, 10, 12).

The use of a collar 50 advantageously allows a simple, fast, accurate and robust press-fitting of the adapter 40 into the sensor case 15, as well as an automatic and simple partitioning of the access orifice 30, with immediate separation of the preservation cavity 41 and of the filling cavity 42, which each extend on a different side of said collar 50 (respectively opposite the front face 50A of the collar 50, oriented toward the air gap 14A 14B and toward the main axis (ZZ'), and the rear face 50B of said collar oriented towards the outside, toward the cables 24 and the sheath 25).

As clearly shown in FIGS. 6 and 8, the collar 50 is preferably formed in one single piece with the adapter 40, and preferably substantially carried in half (in the form of hoops) by each of the two shell parts 44, 45, outwardly protruding on the apparent face of said shell parts 44, 45 (opposite to the inner imprints 44C, 45C).

Said collar 50 is preferably in the shape of a solid disk, whose circumference, preferably circular, corresponds to the shape of the passage section 31S.

Said disk (and therefore more generally the collar 50) is preferably substantially orthogonal to the central axis of the adapter 40, which axis is coincident with the central axis of the sleeve 31 and therefore with the direction of insertion X11 in which the sensor beam 20 is pressed into the sensor case 15 (here perpendicular to the main axis (ZZ')). The collar 50 is therefore preferably substantially orthogonal to the main plane of extension of the printed circuit board 10 forming the acquisition circuit 23.

Said collar 50 may advantageously be reinforced, and in particular stiffened against a pull-out force applied in the direction of insertion X11, by support ribs 51.

It will be noted that said support ribs 51, which will also be embedded in the coating material plug 43, will advantageously participate in reinforcing the fastening of the adapter 40 in the sensor case 15, and in particular in blocking the roll rotation of said adapter 40 about the direction of insertion X11.

The collar 50 will be preferably dimensioned so as to have an interference with the passage section 31S of the sleeve 31 (that is to say excess material, prior to introduction into the access orifice 30, relative to the size at rest of the free passage section 31S) which is substantially comprised between 0.05 mm (five hundredths) and 0.20 mm (twenty hundredths).

In an equivalent manner, the interference might represent substantially 0.5% to 1% of the diameter at rest of the passage section 31S (or of the considered dimension of said passage section 31S, if the passage section 31S is not circular).

Such interference will allow obtaining a sufficient clamping effect upon the introduction of the adapter 40 into the sensor case 15, while at the same time not too much resisting to said introduction and to progress of the sensor beam 20 to the air gap 14A, 14B.

In order to facilitate the adaptation of the collar 50 (by crushing and centripetal radial folding of said collar 50 towards the central axis X11 of the adapter 40), the periphery of the collar 50 might be shaped so as to form a martyr interference member 52, 53, such as a sacrificial annular rib 52 (FIG. 14) or a flexible lip 53 (FIG. 15).

Said martyr interference member 52, 53 will be advantageously arranged and dimensioned so as to be able to compensate for the manufacturing and assembly clearances of the shell parts 44, 45 and of the access orifice 30, in order to certainly provide an interference, even minimal, between the adapter 40 and the lateral wall 31L of the sleeve 31, which interference will be sufficient to obtain the desired fastening and sealing effect.

As in particular illustrated in FIGS. 8 and 13 to 15, the front edge (that is to say the periphery of the front face 50A) of the collar 50 might advantageously have a roundness 54, so as to facilitate the centering, penetration and progression of the adapter 40 in the sleeve 31.

Preferably, and as in particular shown in FIGS. 3 to 5, 10 to 12, and 13 to 15, the sensor case 15 is provided with a (at least one) depression stop 55, such as a (preferably annular) shoulder formed in the passage orifice 30, which automatically blocks the progress of the adapter 40, at a predetermined depth, during the introduction of the sensor beam 20 into the access orifice 30, so as to automatically adjust the penetration depth of the Hall effect cell(s) 11A, 11B in the air gap 14A, 14B.

Said depression stop 55 is preferably arranged so as to act on the collar 50 to stop the depression movement of the adapter 40 when said adapter 40, and therefore the Hall effect cells 11A, 11B contained therein, reach the desired position relative to the main axis (ZZ'), and in particular the desired radial distance relative to said main axis (ZZ'), and therefore the desired position relative to the air gap 14A, 14B.

Preferably, and for a better accuracy of the abutment, the collar 50 comprises a plurality of lugs 56 (at least three lugs) which protrude on said collar 50, and which, more precisely, point towards the main axis (ZZ'), opposite to the filling cavity 42 relative to the collar 50, that is to say which are formed in an elevated position on the front face 50A of the collar, on the side of the stop 55, the preservation cavity 41, and the Hall effect cells 11A, 11B.

Said lugs 56 thus form a plurality of bearing points through which the collar 50 comes into contact against the depression stop 55, as shown in particular in FIGS. 13 to 15.

For a balanced abutment (offering a plane-to-plane type bearing, here according to a bearing plane perpendicular to the direction of insertion X11), the lugs 56 are preferably substantially equally-distributed on the annular front face 50A of the collar 50, like a star about the direction of insertion X11.

Preferably, and as shown in FIG. 8, the adapter 40 is provided with one or more foolproof structure(s) 60, 61, 62, of the orientation flat 61 or foolproof rib 62 type, which cooperate with mating reception structures 65 of the sensor case 15 in order to orient the adapter 40 and guide its insertion into the access orifice 30.

The adapter 40 will advantageously form a kind of male socket, located preferably forwardly (and protruding) from the collar 50, that is to say closer to the main axis (ZZ') and to the air gap 14A, 14B than said collar 50, and which is inserted, upon the introduction of the sensor beam 20 in the sensor case 15, in a female socket carrying the aforementioned reception structures 65.

Preferably, said (female) reception structures 65 will be joined to form a bushing 65 which is integrated, and more particularly molded, into the wall of the flux concentrator support 10, so as to obtain a very precise guidance, which directly takes the structure of the flux concentrator support 10 as a guide reference, and therefore the targeted air gap 14A, 14B.

More particularly, the foolproof structures 60, 61, 62 may comprise at least one, and preferably all the following structures:
- at least one guide cylinder 60 (or portions of guide cylinder arcs 60), of circular base, for the guiding and the centering,
- at least one orientation flat 61, and preferably two diametrically opposite orientation flats 61, preferably formed on the guide cylinder 60, to block the rotation of the adapter 40 on itself, and thus guarantee the positioning and the roll blocking of said adapter 40 relative to the air gap 14A, 14B;
- a foolproof rib 62, allowing to distinguish the top from the bottom of the adapter 40, and therefore to identify the Hall effect cell 11A, 11B intended for each air gap 14A, 14B.

It will be noted that, preferably, and in particular in order to obtain a better finishing while accepting larger, and therefore less restrictive, manufacturing dimensional tolerances, the guide cylinders 60, as well as the orientation flats 61, will be preferably formed in one single piece on one and the same shell part (here the first lower shell part 44), as clearly shown in FIG. 6, which advantageously avoids a fractionation of the foolproof structures 60, 61, 62 by the parting line P0.

Moreover, it will be noted that, preferably, and regardless of the considered variant (with straight outlet or bent outlet), the filling cavity 42 is arranged and the amount of coating material 43 used for the overmolding is defined such that, during the overmolding, the coating material 43 wets (covers) the sheath 25 (the distal end of the sheath 25) over a length L25 of at least 5 mm (FIGS. 3 and 10).

The inventors have indeed found that such a coating length L25 was, moreover with regard to the nature of the used materials (in particular when using a polyurethane sheath of a diameter D25=5 mm, and a polyurethane resin as a coating material 43), necessary and sufficient to guarantee that the pull-out force, that is to say the traction which, exerted on the sheath 25 exposed to the outside, is sufficient to cause a pull-out of the sheath out of the coating material plug 43, is greater than 100 N, or even 200 N at an ambient temperature of 120° C., which corresponds to the targeted pull-out resistance criterion.

Preferably, for compactness and material-saving purposes, the coating length L25 of the sheath 25 will also be less than or equal to 15 mm, or even 10 mm, so that, ultimately, said coating length L25 will be preferably comprised between 5 mm and 15 mm, or between 5 mm and 10 mm.

Preferably, and in particular when the second variant with a bent outlet is implemented, the access orifice 30 of the sensor case 15, and more particularly the external mouthpiece of said access orifice 30, extends outwardly by a chute 70 which forms an angle relative to the filling cavity 42, as illustrated in FIG. 6, and which is arranged so as to receive and guide the sheath 25.

Said chute 70 is more preferably arranged so as to receive the sheath 25 and to guide said sheath 25 substantially parallel to the main axis (ZZ'), about which the torsion torque (T0) that the torque sensor 1 is intended to measure is exerted, as shown in FIGS. 2 to 4.

Advantageously, the presence of such a chute 70, preferably formed integrally with the sleeve 31 and the wall 15L of the sensor case 15, allows stabilizing and maintaining the sheath 25 in its return direction, which return direction is here parallel to the main axis (ZZ') and therefore secant to the plane of extension of the acquisition circuit 23, to the overall orientation direction of the Hall effect cells 11A, 11B, and to the (radial) direction in which the cables 24 emerge from said acquisition circuit 23.

The placement of the sheath 25, and the bending of the cables 24, are therefore facilitated by the presence of said chute 70.

Similarly, the pull-out resistance of the beam 20 is enhanced.

In a particularly preferred manner, in order to further improve the holding of the sheath 25 and the pull-out resistance of the sensor beam 20, the chute 70 is further provided, as detailed in FIG. 7, with a retaining flange 71 which is opposed to the pull-out, in a direction of remoteness radial to the main axis (ZZ') (that is to say in a centrifugal pull-out direction), of said sheath 25 out of the chute 70.

The retaining flange 71 advantageously provides a tightening, of a width D71 less than the diameter D25 of the sheath 25, which, while preferably authorizing the insertion of the sheath 25 into the chute 70 by elastic nesting, avoids any accidental extraction of said sheath 25 out of said chute 70.

Of course, the invention is in no way limited to the sole variants previously described, those skilled in the art being likely to isolate or combine freely together either of the aforementioned features, or to substitute them with equivalents.

The invention claimed is:

1. A method for manufacturing a torque sensor, comprising:
   (a) placing a first slip ring and a second slip ring configured to collect a magnetic flux inside a sensor case, the slip rings being distant from each other and each carrying respectively a first measuring terminal and a second measuring terminal which delimit an air gap therebetween;
   (b) producing a sensor beam and a sensor beam subassembly, the sensor beam subassembly comprising a Hall effect cell configured to be placed in the air gap and measure the magnetic flux therein, and an electrical connection interface which is configured to provide an electrical connection between the Hall effect cell and a computer external to the sensor case; and
   (c) introducing the sensor beam into an access orifice which passes through a wall of the sensor case to open on the air gap, so as to place the Hall effect cell in the air gap, then fastening the sensor beam on the sensor case,
   wherein during step (b), the sensor beam is equipped with an adapter which is arranged to cooperate with the access orifice of the sensor case so as to subdivide the access orifice into a preservation cavity, which opens on the air gap and which contains the Hall effect cell, and a filling cavity, which communicates with an outside, and during step (c), the sensor beam is fastened on the sensor case by overmolding, by casting a resin coating material into the filling cavity to create a plug which links the sensor beam to the sensor case and closes the access orifice, while the adapter prevents the resin coating material from filling the preservation cavity and wetting the Hall effect cell.

2. The method according to claim 1, wherein the adapter is formed by a shell which is obtained by closing a first shell part and a second shell part on each other about a segment of the sensor beam so as to encapsulate the sensor beam segment.

3. The method according to claim 2, wherein the first and second shell parts are assembled against each other on the sensor beam segment according to a parting line along which an assembly clearance between the first shell part and the second shell part is less than or equal to 0.15 mm, so as to impede penetration of the resin coating material inside the shell.

4. The method according to claim 2, wherein an inside of the shell has an imprint of a shape substantially mating a shape of the sensor beam segment configured to receive the adapter, such that, once the shell is closed on the sensor beam, the sensor beam is automatically held in a fixed and predetermined position inside the adapter.

5. The method according to claim 4, wherein the connection interface of the sensor beam comprises an acquisition electronic circuit to which the Hall effect cell is connected and which serves as a support for the Hall effect cell, and the imprint of the shell is engaged on the acquisition circuit to ensure the positioning and the holding of the sensor beam in the adapter.

6. The method according to claim 2, wherein the first and second shell parts are closed on each other and held in a closed position against each other by crimping or clipping forced nesting.

7. The method according to claim 1, wherein the access orifice forms a sleeve which has a passage which is delimited laterally by a lateral wall forming a closed contour, and in that the adapter is provided with a collar which has a shape mating the passage as well as initial dimensions slightly greater than dimensions of the passage, so that, upon the introduction of the sensor beam and of the adapter into the access orifice, an edge of the collar conforms, with interference, to the lateral wall of the access orifice over an entire closed contour of the passage, so that the collar: (i) provides a temporary holding in position of the adapter and of the sensor beam in the case sensor, by tight nesting, while waiting for overmolding; and (ii) forms a bottom wall of the filling cavity which cooperates with the lateral wall of the access orifice in order to form a sealed link against flow of the resin coating material, and which thus allows containing the resin coating material on a side of the access orifice which is open to the outside during the overmolding.

8. The method according to claim 1, wherein the sensor case is provided with a depression stop which automatically blocks progress of the adapter at a predetermined depth, upon the introduction of the sensor beam into the access orifice, so as to automatically adjust the penetration depth of the Hall effect cell in the air gap.

9. The method according to claim 1 wherein the adapter is provided with a foolproof structure that is flat or rib type which cooperates with mating structures of the sensor case in order to orient the adapter and guide its insertion into the access orifice.

10. The method according to claim 1, wherein the sensor beam comprises, at any of its distal ends configured to be introduced and embedded in the sensor case, an acquisition electronic circuit which carries the Hall effect cell, as well as a plurality of electrical cables which are grouped in a sheath and which link the acquisition electronic circuit to a remote connector located at a proximal end of the sensor beam, and in that the filling cavity is provided and an amount of the resin coating material used for overmolding is defined such that, upon the overmolding, the resin coating material wets the sheath over a length of at least 5 mm.

11. The method according to claim 10, wherein the access orifice of the sensor case extends externally by a chute forming an angle relative to the filling cavity, the chute being arranged so as to receive the sheath and guide the sheath, the chute being further provided with a retaining flange which opposes to pull-out in a direction of remoteness radial to a main axis of the sheath out of the chute.

* * * * *